US006721695B1

(12) United States Patent
Chen et al.

(10) Patent No.: US 6,721,695 B1
(45) Date of Patent: Apr. 13, 2004

(54) METHOD AND APPARATUS FOR EVALUATING THE RUNABILITY OF A PHOTOMASK INSPECTION TOOL

(75) Inventors: Xiaoming Chen, Austin, TX (US); Charles H. Howard, Austin, TX (US); Franklin Dean Kalk, Austin, TX (US); Kong Son, Fremont, CA (US); Paul Chipman, Pflugerville, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 233 days.

(21) Appl. No.: 09/989,509

(22) Filed: Nov. 20, 2001

Related U.S. Application Data

(62) Division of application No. 09/534,808, filed on Mar. 24, 2000, now Pat. No. 6,482,557.

(51) Int. Cl.[7] .................................................. G06G 7/48
(52) U.S. Cl. ........................... 703/7; 382/144; 382/152; 702/35; 430/30
(58) Field of Search .............................. 703/1–2, 7, 22; 382/144, 152; 702/35, 94; 430/5, 30, 22; 356/237, 239

(56) References Cited

U.S. PATENT DOCUMENTS

| | | | |
|---|---|---|---|
| 5,781,656 A | * 7/1998 | Hagino et al. | 382/144 |
| 5,966,677 A | * 10/1999 | Fiekowsky | 702/95 |
| 6,048,649 A | 4/2000 | Burke et al. | 430/5 |
| 6,263,292 B1 | 7/2001 | Fiekowsky | 702/95 |
| 6,297,879 B1 | * 10/2001 | Yang et al. | 356/237.5 |

OTHER PUBLICATIONS

Fiekowsky, "Defect Printability Measurement on the KLA–351: Correlation to Defect Sizing Using the AVI Metrology System," (Sep. 1999) (downloaded text available at: http://www.aviphotomask.com/PM1999.htm).*

* cited by examiner

Primary Examiner—Samuel Broda, Esq.
(74) Attorney, Agent, or Firm—Baker Botts L.L.P.

(57) ABSTRACT

A method and apparatus evaluates the runability of a photomask inspection tool that inspects plural sets of die, each die having a standard simulated industrial device feature at plural technology nodes. A technology node size is determined for each feature at which inspection by the tool provides no false detection of faults. A sensitivity module included on a photomask test plate along with a runability module allows determination of inspection tool sensitivity and runability in a single test sequence.

10 Claims, 4 Drawing Sheets

UIS18

| | | | | | | | | | | |
|---|---|---|---|---|---|---|---|---|---|---|
| | | | | | | 5° | 0.11μm | | | |
| 0.11μm | 0.44μm | 0.41μm | 0.30μm | 0.26μm | 0.10μm | 10° | 0.20μm | 0.44μm | 0.44μm | 0.44μm |
| | | | | | | 20° | 0.31μm | | | |
| 0.13μm | 0.51μm | 0.53μm | 0.40μm | 0.30μm | 0.20μm | 30° | 0.40μm | 0.52μm | 0.52μm | 0.52μm |
| | | | | | | 35° | 0.51μm | | | |
| 0.15μm | 0.59μm | 0.60μm | 0.50μm | 0.36μm | 0.30μm | 40° | 0.59μm | 0.60μm | 0.60μm | 0.60μm |
| | | | | | | 45° | 0.65μm | | | |
| 0.18μm | 0.73μm | 0.72μm | 0.60μm | 0.42μm | 0.40μm | 50° | 0.71μm | 0.72μm | 0.72μm | 0.72μm |
| 0.25μm | 0.99μm | 0.99μm | 0.80μm | 0.60μm | 0.50μm | 70° | 0.79μm | 1.00μm | 1.00μm | 1.00μm |
| 0.35μm | 1.40μm | 1.38μm | 1.20μm | 0.80μm | 0.70μm | 90° | 0.91μm | 1.40μm | 1.40μm | 1.40μm |
| TECH NODES | | | | | | | | | | |
| | P1 | P2 | P3 | P4 | P5 | P6 | P7 | P8 | P9 | P10 |

| UIS18 | P1 | P2 | P3 | P4 | P5 | P6 | P7 | P8 | P9 | P10 |
|---|---|---|---|---|---|---|---|---|---|---|
| 0.11μm | 0.44μm | 0.41μm | 0.30μm | 0.26μm |  | 5° | 0.11μm |  | 0.44μm | 0.44μm |
| 0.13μm | 0.51μm | 0.53μm | 0.40μm | 0.30μm | 0.10μm | 10° | 0.20μm | 0.44μm |  |  |
| 0.15μm | 0.59μm | 0.60μm | 0.50μm | 0.36μm | 0.20μm | 20° | 0.31μm | 0.52μm | 0.52μm | 0.52μm |
|  |  |  |  |  |  | 30° | 0.40μm |  |  |  |
| 0.18μm | 0.73μm | 0.72μm | 0.60μm | 0.42μm | 0.30μm | 35° | 0.51μm | 0.60μm | 0.60μm | 0.60μm |
|  |  |  |  |  |  | 40° | 0.59μm |  |  |  |
| 0.25μm | 0.99μm | 0.99μm | 0.80μm | 0.60μm | 0.40μm | 45° | 0.65μm | 0.72μm | 0.72μm | 0.72μm |
|  |  |  |  |  | 0.50μm | 50° | 0.71μm | 1.00μm | 1.00μm | 1.00μm |
|  |  |  |  |  |  | 70° | 0.79μm |  |  |  |
| 0.35μm | 1.40μm | 1.38μm | 1.20μm | 0.80μm | 0.70μm | 90° | 0.91μm | 1.40μm | 1.40μm | 1.40μm |
| TECH NODES |  |  |  |  |  |  |  |  |  |  |

FIG. 6

UIS18

| TECH NODES | P1 | P2 | P3 | P4 | P5 | P6 | P7 | P8 | P9 | P10 |
|---|---|---|---|---|---|---|---|---|---|---|
| 0.11μm | | | | | | 5° | 0.11μm | | | |
| 0.13μm | 0.44μm | 0.44μm | 0.30μm | 0.26μm | 0.10μm | 10° | 0.20μm | 0.44μm | 0.44μm | 0.44μm |
| | 0.52μm | 0.52μm | 0.40μm | 0.30μm | 0.20μm | 20° | 0.31μm | 0.52μm | 0.52μm | 0.52μm |
| 0.15μm | 0.60μm | 0.60μm | 0.50μm | 0.36μm | 0.30μm | 30° | 0.40μm | | | |
| | | | | | | 35° | 0.51μm | | | |
| | 0.72μm | 0.72μm | 0.60μm | 0.42μm | 0.40μm | 40° | 0.59μm | 0.60μm | 0.60μm | 0.60μm |
| 0.18μm | | | | | | 45° | 0.65μm | | | |
| | | | | | 0.50μm | 50° | 0.71μm | 0.72μm | 0.72μm | 0.72μm |
| 0.25μm | 1.00μm | 1.00μm | 0.80μm | 0.60μm | | 70° | 0.79μm | 1.00μm | 1.00μm | 1.00μm |
| 0.35μm | 1.40μm | 1.40μm | 1.20μm | 0.80μm | 0.70μm | 90° | 0.91μm | 1.40μm | 1.40μm | 1.40μm |

METHOD AND APPARATUS FOR EVALUATING THE RUNABILITY OF A PHOTOMASK INSPECTION TOOL

CROSS REFERENCE TO RELATED APPLICATIONS

This application is a divisional from U.S. patent application Ser. No. 09/534,808, filed by Xiaoming Chen et al. on Mar. 24, 2000 and entitled "A METHOD AND APPARATUS FOR EVALUATING THE RUNABILITY OF A PHOTOMASK INSPECTION TOOL" now U.S. Pat. No. 6,482,557.

TECHNICAL FIELD

This invention relates in general to the field of microelectronic device manufacturing, and more particularly to a method and system for evaluating photomask inspection tools.

BACKGROUND OF THE INVENTION

Over the past several years, the performance of microelectronic devices fabricated on semiconductor substrates has rapidly and consistently improved. Processing speeds have increased dramatically as device technology nodes have shrunk. For the most part, the dramatic improvements in microelectronic device performance have resulted from the use of the same underlying manufacturing technology. For instance, manufacturing of a microprocessor device on a silicon substrate involves patterning several layers of features in the silicon and depositing metal, such as aluminum or copper, in the features. Microprocessor device patterns are created on a photomask which is then used to etch the patterns into a semiconductor substrate. Each layer of a microelectronic device may include a number of different features that interact with each other and with different layers of the device. The photomask generally must have precise device feature dimensions for accurate etching of a desired pattern onto a substrate.

To ensure the accuracy of the features on a photomask, photomasks are typically inspected before they are used to manufacture semiconductor devices. Photomask inspection tools perform automated inspections of photomasks through the use of algorithms that help identify faults or defects in the photomask patterns. A typical inspection of a photomask is likely to identify a number of faults since the manufacturing of a photomask is prone to some error. Once an inspection tool identifies faults, the faults are repaired by a repair tool and the repaired photomask is used for manufacturing semiconductor devices. Accurate inspection and repair of photomasks is an important process for microelectronic device manufacturing since a single undetected fault in a photomask can result in costly manufacturing errors.

Photomask inspection tools are typically qualified for a desired sensitivity, meaning the inspection tool's ability to find a smallest defect. For instance, the Verimask, available from Dupont Photomasks, Inc., is commonly used in a photomask production environment as a daily qualification test vehicle for photomask inspection tools. An inspection tool's sensitivity test typically involves the inspection with the tool of a sensitivity module, such as the Verithoro module, to determine the size of programmed defects that the inspection tool detects and/or fails to detect. Programmed defects are intentional faults included in a photomask to ensure that inspection of the photomask detects known faults down to a known sensitivity level. An evaluation of the sensitivity of a photomask inspection tool evaluates the tool's ability to detect programmed defects of predetermined size, but fails to provide a complete evaluation of the inspection tool's ability to provide accurate inspection results for typical device features of different sizes. For instance, inspection of some features within the sensitivity of an inspection tool may result in false fault detections.

An evaluation of an inspection tool's sensitivity provides some indication of the size of the smallest programmed defect that the tool accurately detects but fails to completely assess how well the inspection tool is able to run. The robustness of an inspection tool, meaning the inspection tool's ability to run in a production environment, is difficult to define based on the tool's sensitivity, especially in light of the expanding number of features found on photomasks. As one example, optical proximation corrections ("OPC") introduce optical corrections to the mask pattern to correct for refraction errors that occur when the mask is used to etch a substrate. As device feature dimensions shrink, the nature of corner roundings of OPC features has greater effects on the inspectivity of an inspection system due to the difference between the data and mask. Essentially the inspection tool thinks the difference is a defect, but the difference is actually a feature rounding. Therefore, the inspection system signals a false defect when it is unable to differentiate rounding.

SUMMARY OF THE INVENTION

Therefore a need has arisen for a method and apparatus which evaluates the robustness of a photomask inspection tool's ability to inspect a photomask with best sensitivity.

A further need exists for a method and apparatus which evaluates the runability of a photomask inspection tool for locating false errors associated with photomask features at different technology nodes.

In accordance with the present invention, a method and apparatus is provided that substantially eliminates or reduces disadvantages and problems associated with previously developed and methods and apparatus for evaluating the effectiveness of photomask inspection tools. Plural device features are written on a photomask at plural technology nodes. The runability of the inspection tool is determined by the runable smallest technology node for the features at which no inspection false errors occur.

More specifically, a set of die simulates a first feature with each die in the set having a different technology node. A second set of die simulates a second feature with each die in the set having a different technology node. The die are inspected by the inspection tool and the technology node is determined for each feature at which no false defect inspection errors occur. The technology nodes for each feature at which no false defect reports occur is noted to define the runability of the inspection tool. In addition, one or more die having programmed defects may be inspected to determine the tool's sensitivity, meaning the smallest defect that the inspection tool is able to detect.

The sets of features at different technology nodes are written on a photomask test plate as one or more runability modules, each module having an array of die. Each column of the array includes a set of die having a feature common to microelectronic devices. Each row of the array represents a technology node corresponding to industry technology nodes. Thus, for a given feature, inspection of die having that feature at different technology nodes allows a determination of the smallest technology node at which the inspection tool will successfully test for the feature without noting errors. Evaluation of the runability of a photomask inspection tool results from a determination of the minimum feature technology nodes for features relevant to the device being fabricated.

The present invention provides a number of important technical advantages. One important technical advantage is that a quantifiable evaluation of the robustness of a photomask inspection tool is made available. A determination is made of the smallest technology node that an inspection tool is able to detect without false detection of faults for a variety of device features. This enables device manufacturers to accurately access the technology node that an inspection tool can effectively inspect not only in light of the tool's minimum detectable defect size but also for inspectability of specific features commonly found in industry design patterns. Thus, for instance, allocation of inspection tools to appropriate tasks and investment decisions for new inspection tools may be made based on runability rather than simply minimum detectable defect size. In addition, more accurate quantification of performance for new inspection tools and upgrades is made possible.

Another important technical advantage of the present invention is that it provides a quantifiable measurement of the runability of an inspection tool. A runability chart aids in the selection of inspection tools for particular inspection functions based on actual inspection results for known features and technology nodes. Also, runability charts aid in the verification of mask designs. The manufacturability and inspectability of new design patterns is evaluated by comparison of runability results for inspection tools with proposed designs, allowing design revisions that take advantage of existing inspection capability.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein:

FIG. 6 depicts a runability chart for an inspection tool.

DETAILED DESCRIPTION OF THE INVENTION

Preferred embodiments of the present invention are illustrated in the FIGURES, like numeral being used to refer to like and corresponding parts of the various drawings.

Photomask inspection tools are commonly tested to determine the sensitivity of the tool, meaning the tool's ability to find the smallest defect. Programmed global defects are intentionally inserted in photomask patterns to check the accuracy and reliability of inspection tools. Sensitivity for detecting a smallest defect is determined by inspecting programmed defects at desired technology nodes. However, sensitivity does not characterize the runability of an inspection tool, meaning the tool's ability to run various technology levels, OPC features and sizes with maximum sensitivity and no false detection of defects. Runability of an inspection system is an essential evaluation for a complete overall understanding of the inspection system's capabilities.

Figure 1:
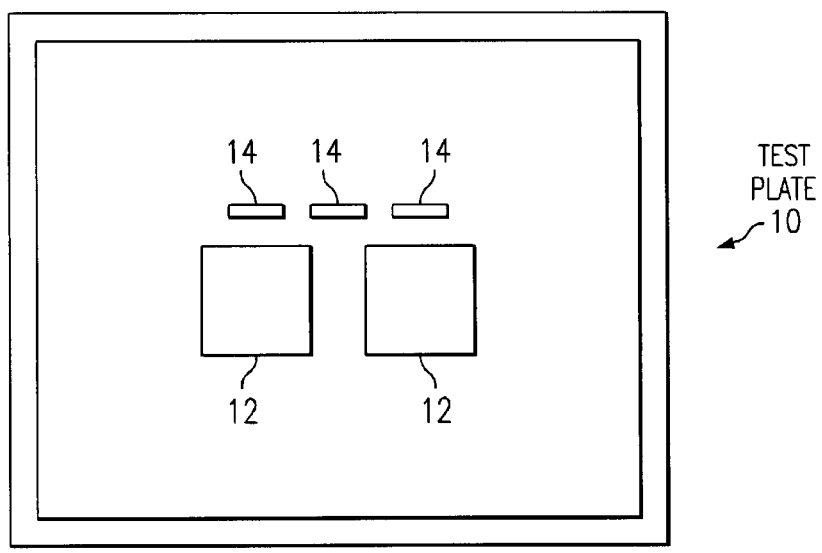
FIG. 1 depicts a photomask test plate apparatus for evaluating runability of an inspection tool.

Referring now to FIG. 1, a photomask test plate 10 is depicted with runability modules 12 and sensitivity modules 14. Sensitivity modules 14 are conventional modules for evaluating sensitivity of an inspection tool in detecting programmed defects, such as the Verithoro sensitivity module available from Dupont Photomasks, Inc. Each runability module 12 is a ten-by-ten array of die with each die having a 4,000 $\mu$m by 4,000 $\mu$m total area and a pattern area of 3,000 $\mu$m by 3,000 $\mu$m. The inclusion of two runability modules 12 allows for die-to-die inspection testing and comparison. Each pattern area includes repeated occurrences of runability features such as standard industry feature patterns, OPC feature patterns and noise features. The critical dimensions of the feature patterns on the runability module 12 and the programmed defects on the sensitivity modules 14 are measured to a Polystyrene Nanosphere Standard, which are traceable to the National Institute of Standards and Technology (NIST). Sensitivity modules 14 may include a row of transmission defects that are measured on AIMS, sold by IBM Corporation.

Figure 2:
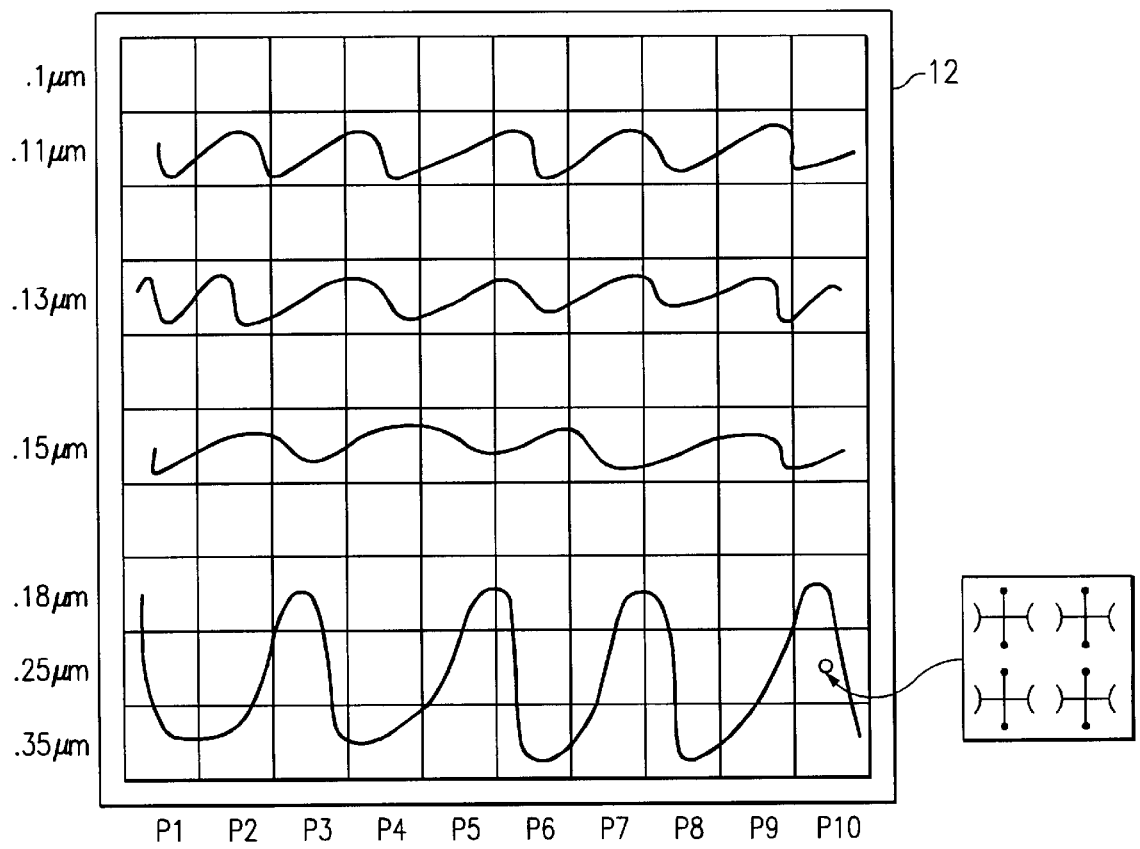
FIG. 2 depicts a runability module having a ten-by-ten die array of features P1–P10 at different technology nodes.

Referring now to FIG. 2, a runability module 12 is depicted as a ten-by-ten array of die. The rows aligned along the Y axis represent technology nodes of between 0.35 $\mu$m to 0.11 $\mu$m. The columns aligned along the X axis of runability module 12 represent features used in microelectronic devices. Thus, for instance, each die in column P1 has repeated occurrences of the same feature, with the feature in each die drawn to the technology node associated with the Y axis. For instance, the expansion of the runability pattern area within die P10 at the 0.25 $\mu$m technology node shows repeated occurrences of a feature 16 associated with P10 configured as within a 0.25 $\mu$m device photomask.

Figure 3:
FIG. 3 depicts features P1–P10 and associated critical dimension data for various technology nodes.
Figure 3:
Figure 3:
Figure 3:
Figure 3:
Figure 3:
Figure 3:
Figure 3:
Figure 3:
Figure 3:

Referring now to FIG. 3, an example of a runability module critical dimension certification worksheet is depicted, including images of the features associated with columns P1–P10. The following table illustrates feature identifications for feature types P1 through P10 with the feature shape found in the photomask die and a description of the simulation provided by each feature shape:

| Type | Shape | Description of Simulation |
| --- | --- | --- |
| P1 | Line | Line/Space |
| P2 | Contact | Contacts |
| P3 | Hammer Head on Line | Hammer Head Impact |
| P4 | Serif on Contact | Serif Impact |
| P5 | Assist Feature on Line | Assist |
| P6 | Varied Angle | Angle Impact |
| P7 | Varied Gap | Gap Impact |
| P8 | Combo HH and Assist | Combination Impact |
| P9 | Combo Inside and Outside Serif | Combination Impact |
| P10 | Combo Jogs and Serifs | Combination Impact |

The critical dimensions depicted in FIG. 3 may either be measured directly from the photomask or inferred from design data.

Figure 4:
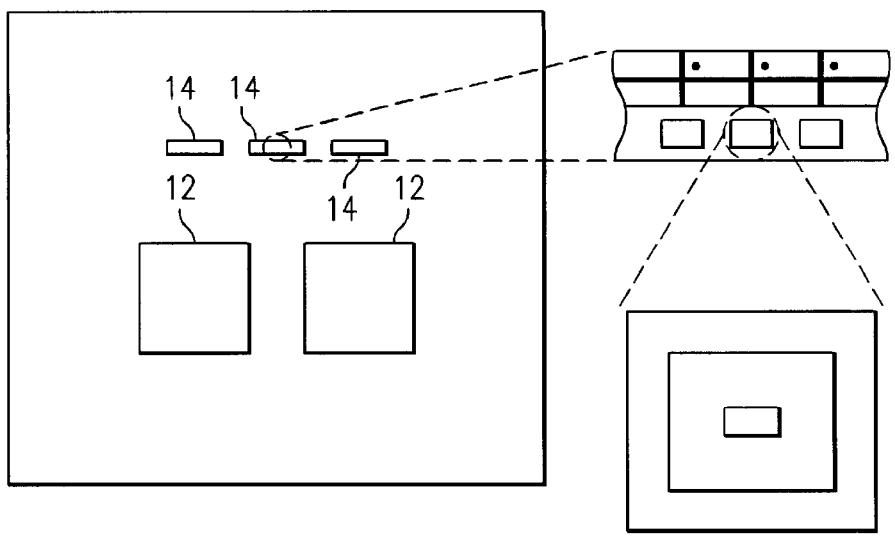
FIG. 4 depicts a sensitivity module having a transmission defect.

Referring now to FIG. 4, an expansion of sensitivity module 14 is depicted to illustrate a transmission defect type 17 for determining the sensitivity of an inspection tool in detecting transmission defects. A transmission defect cell 17 is placed underneath a pin dot defect cell. Each transmission defect cell 17 is a 40 $\mu$m by 40 $\mu$m chrome box with a 0.9

μm clear center placed within 20 μm by 20 μm image window. The transmission defects are made with geranium stain to have a transmission defect range of between one percent (1%) and thirty percent (30%) transmission loss. Transmission loss is calculated as the referenced transmission of the clear contact without geranium stain minus the measured transmission with geranium stain divided by the referenced transmission to provide percentage calculation.

In operation, the runability of an inspection tool is evaluated by inspecting each die of the runability module to determine the technology nodes for each feature at which inspection provides no false detection of faults. For instance, referring now to FIG. 5, a chart demonstrates a maximum sensitivity region 18 and minimum sensitivity region 20 defined by the technology node and feature for which an inspection test produced no false fault detections. The maximum sensitivity region 18 corresponds to a maximum sensitivity setting for the inspection tool, while the minimum sensitivity region 20 corresponds to the minimum sensitivity setting of the inspection tool. As FIG. 5 depicts, a higher tool sensitivity setting will result in false fault detections at larger technology nodes than less sensitive inspection tool settings.

Figure 5:
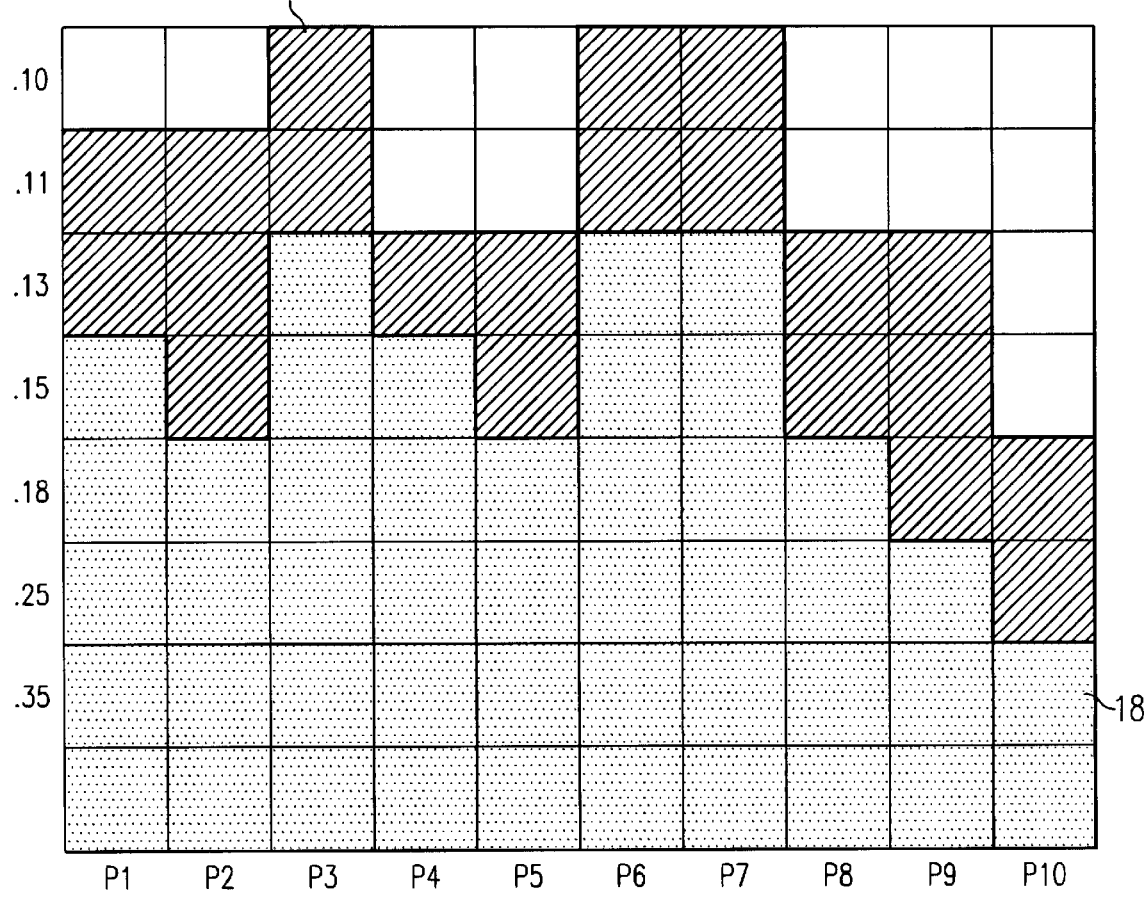
FIG. 5 depicts a runability chart defining the range of sensitivity for features P1–P10.

Runability charts as depicted by FIG. 5 provide a basis for comparing inspection tool runability under a variety of circumstances. For instance, a single inspection tool may be compared at different sensitivity settings, or with the application of different inspection algorithms, such as algorithms designed to upgrade a tool. Thus, runability charts provide a basis for a direct comparison between various inspection circumstances and upgrades to inspection tools. The runability chart also provides a clear basis for comparison between runability of different inspection tools.

Referring now to FIG. 6, an example of a runability chart for an inspection tool is depicted. At the 0.13 μm technology note, the inspection tool did not detect false defects for features P1, P3 and P7. Thus, assuming the tool has adequate sensitivity, the runability chart indicates runability for the tool for photomasks having features P1, P3 and P7. However, features P2, P5 and P8 are not inspectable with the tool at technology nodes shock below 0.25 μm. Feature P4 is not inspectable by the tool at any tested technology node. Thus, in summary, the runability chart depicted by FIG. 6 illustrates the features that the inspection tool is able to accurately inspect for tested technology nodes.

Although the present invention has been described in detail, it should be understood that various changes, substitutions and alterations can be made hereto without departing from the spirit and scope of the invention as defined by the appended claims.

What is claimed is:

1. An apparatus for evaluating the runability of a photomask inspection tool, the apparatus comprising:
    a photomask test plate; and
    plural die written on the test plate, each die having repeated occurrences of a feature written at a technology node;
    wherein inspection of the plural die with the tool provides a determination of the smallest technology node at which the tool identifies a feature without detecting false defects.

2. The apparatus of claim 1 further comprising:
    a sensitivity module written on the test plate for determining the smallest defect that the tool can detect.

3. The apparatus of claim 1 wherein the plural die are written as an array having columns with each die in a column having repeated occurrences of the same feature, the array having rows with each die in a row having repeated occurrences of a feature at the same technology node.

4. The apparatus of claim 3 wherein the plural die are written as a first and second array for die-to-die comparison inspection.

5. The apparatus of claim 3 further comprising:
    a sensitivity module having a transmission defect.

6. An apparatus for evaluating the runability of a photomask inspection tool, the apparatus comprising:
    a photomask test plate; and
    a runability module written on the test plate, the runability module including plural features at plural technology nodes;
    wherein the runability module facilitates a determination by the inspection tool of the smallest technology node at which a feature is identified without the tool detecting false errors.

7. The apparatus of claim 6 further comprising:
    a sensitivity module written on the test plate, the sensitively module operable to determine the smallest defect that the tool can detect.

8. The apparatus of claim 6 further comprising the plural features formed in plural die in the runability module.

9. The apparatus of claim 8 further comprising the plural die written as an array including:
    columns with each die in a column having repeated occurrences of the same feature; and
    rows with each die in a row having repeated occurrences of the same technology node.

10. The apparatus of claim 9 further comprising the plural die written as a first and second array for die-to-die comparison inspection between a die in the first array and a corresponding die in the second array.

* * * * *